(12) United States Patent
Fukunaga

(10) Patent No.: US 6,194,897 B1
(45) Date of Patent: Feb. 27, 2001

(54) MAGNETIC SENSOR APPARATUS

(75) Inventor: Kazuo Fukunaga, Ichikawa (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/166,777

(22) Filed: Oct. 6, 1998

(30) Foreign Application Priority Data

Oct. 6, 1997 (JP) .................................................... 9-287567

(51) Int. Cl.$^7$ .................................................... G01R 33/04
(52) U.S. Cl. ............................ 324/255; 324/253; 324/260
(58) Field of Search .................................. 324/244, 249, 324/252, 253, 255, 260, 258, 239; 360/111

(56) References Cited

U.S. PATENT DOCUMENTS 6,121,770 * 9/2000 Sudo ..................................... 324/244

FOREIGN PATENT DOCUMENTS

| 2617498 | 3/1997 | (JP) . |
| 9-105772 | 4/1997 | (JP) . |
| 9-166437 | 6/1997 | (JP) . |
| 9-211094 | 8/1997 | (JP) . |

* cited by examiner

*Primary Examiner*—Jay Patidar
(74) *Attorney, Agent, or Firm*—Oblon, Spivak, McClelland, Maier & Neustadt, P.C.

(57) ABSTRACT

The present invention relates to a magnetic sensor apparatus which is capable of detecting a very weak magnetic field even when the DC bias magnetic field is at zero and greatly reducing detection output occurring due to factors such as inconsistency of a magnetic body, temperature fluctuations, distortional fluctuations and drift. A magnetic sensor element S generates a pulse-type signal which is in proportion to a rate of change of the magnetic permeability of a magnetic body M and the size of an external magnetic field at a detection winding Wd. A drive circuit 11 cyclically changes the magnetic permeability of the magnetic body by supplying a pulse-type drive current for sampling to the magnetic body. A peak value detection unit 12 detects a positive peak value and a negative peak value of the pulse-type signal. A feedback circuit supplies an AC current which is in synchronization with the pulse-type drive current to the detection winding and also superimposes a DC current component on the AC current to set the absolute values of the positive peak value and the negative peak value equal to each other. The size of a magnetic field to be detected is detected based upon a DC current component at the detection winding.

7 Claims, 4 Drawing Sheets

MAGNETIC SENSOR APPARATUS

BACKGROUND OF THE INVENTION

1. Field of the Invention

The present invention relates generally to a magnetic sensor apparatus, and more particularly to a magnetic sensor apparatus that can detect very weak magnetic fields.

2. Discussion of Background

The methods for detecting magnetic fields in the known art include the parallel flux gate method and the cross flux gate method. In the parallel flux gate method, which employs an exciting winding and a detection winding provided at a toroidal core or the like, the direction of a magnetic field resulting from magnetic excitation and the direction of the magnetic field to be detected are parallel.

In the cross flux gate method, a detection winding is provided around an amorphous magnetic metal alloy wire or foil and a current is directly supplied to the amorphous magnetic metal alloy wire or the foil to achieve an exciting function. In this method, the direction of the magnetic field resulting from magnetic excitation and the direction of the magnetic field to be detected extend orthogonally to each other.

In both of the methods described above, the magnetic permeability of a magnetic body is changed through magnetic excitation to generate an induced voltage, which is in proportion to an external magnetic filed generated at the detection winding. However, in the former method, since the impedance at the exciting winding is high, the excitation speed cannot be increased. Thus, there are problems in that the sensitivity is poor and that the apparatus will become expensive to produce.

In the case of a sensor employing an amorphous magnetic metal which is an example of the latter method, miniaturization can be achieved easily while achieving a high degree of sensitivity. However, since the relative coercivity is great, it is difficult to perform detection at a zero magnetic field. Thus, a bias magnetic field is required as a means for achieving detection at the zero magnetic field. However, the stability of the sensor output at the time of bias magnetic field application is problematic since it is subject to the influence of temperature-related sensitivity fluctuations and drift.

An example of a magnetic sensor element employing the cross flux gate method is disclosed in Japanese Patent No. 2,617,498, and Japanese Unexamined Patent Publication No. 166437/1997 discloses an example of a detection circuit employing this magnetic sensor element.

In the magnetic sensor element adopting the cross flux gate method, a detection winding is wound around a conductive magnetic body having a high degree of magnetic permeability, which is formed in a linear shape, a rod shape, a band shape or the like and is provided with a linear portion in the lengthwise direction, and the magnetic body is excited to a point close to saturation by supplying a pulse current in the direction of the length of the magnetic body to greatly change the magnetic permeability $\mu$ of the magnetic body. A voltage V induced at the detection winding at this point is determined through the formula presented below and is in proportion to an external magnetic field. Consequently, the external magnetic field can be detected based upon the voltage V determined through the following formula:

$$V = d(\mu \cdot H \cdot S)/dt;$$

wherein

"$\mu$" represents magnetic permeability of the magnetic body itself;

"H" represents external magnetic field; and

"S" represents the cross sectional area of the magnetic body.

However, the magnetic field generated by a pulse current, which extends orthogonally to the direction in which the detection winding is transversed does not generate an induced voltage unless another magnetic cross flux is present. The induced voltage V increases as the external magnetic cross flux (magnetic field) becomes larger or the magnetic permeability of the magnetic body itself becomes higher, and as the pulse that is applied is steeper. Conductive magnetic bodies suited for this application may be constituted of cobalt amorphous magnetic metal alloy wires, foils or the like.

FIG. 3 shows an example of a magnetic sensor element adopting the cross flux gate method. A magnetic sensor element S is achieved by etching conductive amorphous magnetic alloy foil formed in a band shape which is pasted onto an insulating substrate 1 constituted of an epoxy resin or the like to constitute a magnetic body M with a specific pattern, with a wire loop wound around the magnetic body M to constitute a detection winding Wd.

The dimensions of the magnetic body M having a linear portion in the lengthwise direction may be, for instance, 5 mm (width)×15 mm (length). The two ends of the magnetic body M are each connected to an excitation terminal 2 secured to the insulating substrate 1, whereas the two lead-out ends of the detection winding Wd are each connected to a detection terminal 3 secured to the insulating substrate 1.

Now, since a magnetic body, by nature, demonstrates hysteresis, no change occurs in the magnetic flux and no output manifests at the detection winding unless there is a magnetic field that exceeds its coercivity. Thus, in order to detect a very weak magnetic field such as geomagnetism with the magnetic sensor element S described above as an analog signal, a DC bias magnetic field achieving a specific size is applied in the prior art to obtain a signal output. In addition, when good linearity is to be achieved, the so-called feedback method is employed. Namely, when an external magnetic field increases, the signal corresponding to the increase is amplified and control is implemented to reduce the DC bias magnetic field in the reverse direction. If the degree of amplification at the amplifier circuit is set to a value as high as possible, the synthesized magnetic field applied to the magnetic sensor element in a feedback equilibrium state achieves a value in the vicinity of the DC bias magnetic field at all times. In other words, a signal using this DC bias magnetic field as its operating point is output. However, due to factors such as inconsistency of the magnetic characteristics, temperature-related fluctuations, distortion-related fluctuations and drift in the magnetic permeability which is represented as the rate of change in the B-H curve of the magnetic body, the output signal using the DC bias magnetic field as its operating point tends to fluctuate easily and, therefore, it is difficult to obtain a stable output signal.

SUMMARY OF THE INVENTION

It is an object of the present invention to provide a magnetic sensor apparatus which is not required to employ the DC magnetic bias method that tends to cause instability in the output signal.

It is a further object of the present invention to provide a magnetic sensor apparatus capable of detecting a very slight magnetic field even when the DC bias magnetic field is zero.

It is a still further object of the present invention to provide a magnetic sensor apparatus in which inconsistency in the characteristics of the magnetic body, temperature-related fluctuations, distortion-related fluctuations and drift, occuring in the detection output, can be greatly reduced.

In order to achieve the objects described above, the magnetic sensor apparatus according to the present invention includes a magnetic sensor, a means for excitation, a peak detection portion and a feedback circuit.

The magnetic sensor, which is provided with a magnetic body and a detection winding wound around the magnetic body, generates a pulse-type electric signal which is in proportion to the rate of change in the magnetic permeability of the magnetic body and also in proportion to the size of an external magnetic field, at the detection winding.

The means for excitation cyclically changes the magnetic permeability of the magnetic body by supplying a pulsed drive current for sampling to the magnetic body. The peak value detection portion detects both the positive peak value and the negative peak value of the pulse-type electric signal.

The feedback circuit supplies an AC current which is in synchronization with the pulsed drive current for sampling to the detection winding and also superimposes a DC current component onto the AC current so that the absolute values of the positive peak value and the negative peak value of the pulse-type electric signal are set equal to each other.

The detection winding outputs a detection signal that contains the DC current component indicating the size of the magnetic field to be detected.

In the magnetic sensor apparatus, the means for excitation may be provided with an oscillator for regulating the cyclic frequency of the pulsed drive current so that, by adding an AC signal of the oscillator to a portion of the feedback circuit, the positive peak value and the negative peak value of the pulse-type electric signal can both be synchronized with the cycle of the pulsed drive current for sampling.

DETAILED DESCRIPTION OF THE PREFERRED EMBODIMENTS

Figure 1:
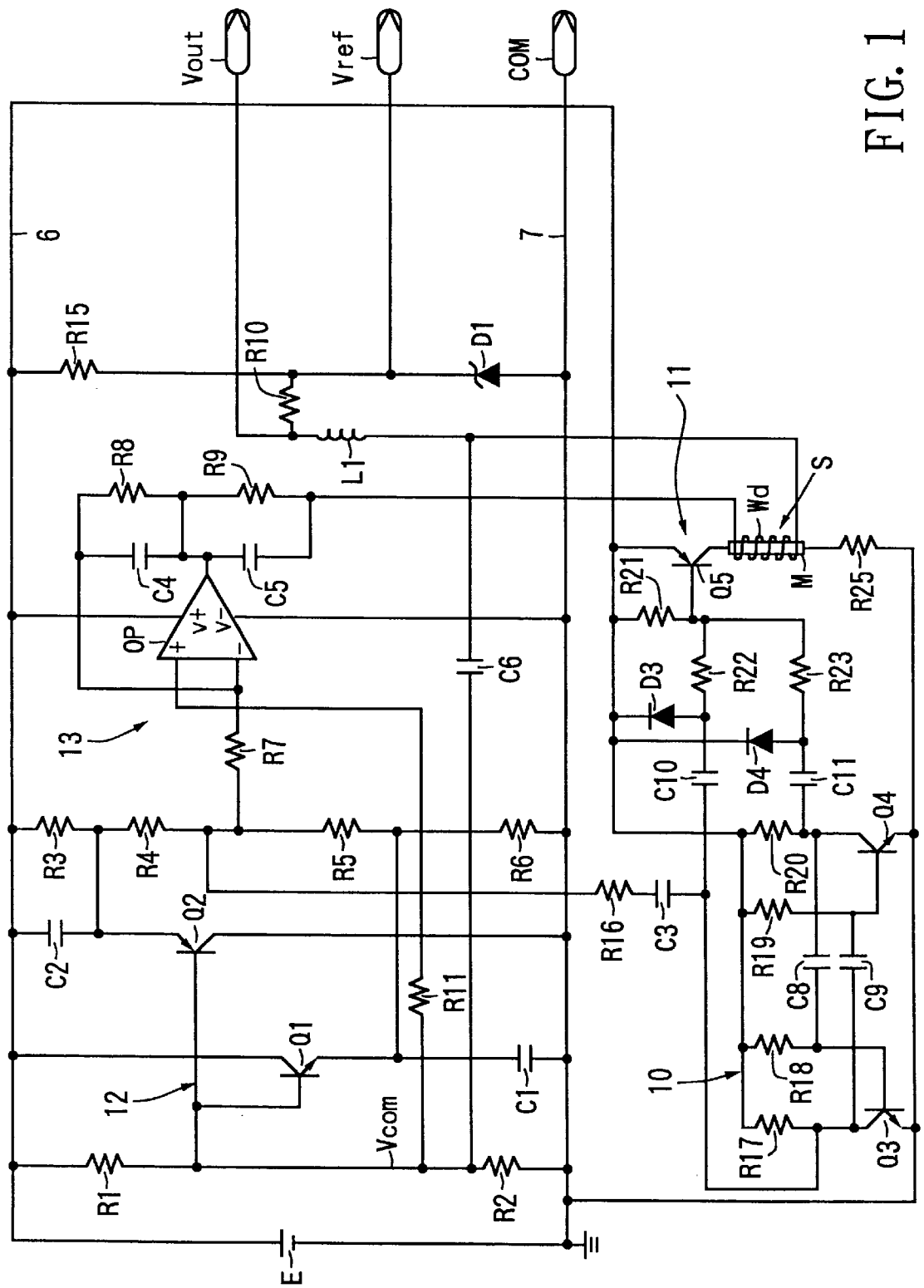
FIG. 1 is a circuit diagram illustrating the circuit structure of the magnetic sensor apparatus according to the present invention.

Referring to FIG. 1, a DC voltage (e.g. 5V) of a DC source E is supplied between a source input line 6 and an earth ground line 7 connected to an earth terminal COM. In addition, a pulse current is supplied to a magnetic body M of a magnetic sensor element S to cyclically change the magnetic permeability of the magnetic body M. An oscillator 10 for sampling signal generation and a drive circuit 11 are provided to constitute a means for excitation. The means for excitation causes the magnetic body M to shift from an unsaturated state to a saturated state. Furthermore, a peak value detection unit 12 and a comparator amplifier unit 13 are provided to constitute a means for signal detection that detects a signal induced at a detection winding Wd of the magnetic sensor element S.

The oscillator 10 for sampling signal generation is constituted of an astable multivibrator comprising transistors Q3 and Q4, resistors R17 to R20 and capacitors C8 and C9. An oscillation frequency fs at the oscillator 10 is determined by R18, C8, R19 and C9. The phases of two square wave signals at the collector sides of the transistors Q3 and Q4 are offset from each other by a half cycle, as shown in FIG. 2(a) and FIG. 2(b). These two square wave signals are applied to the drive circuit 11 at a rear stage. Of the two square wave signals, one is added to the middle point of the peak value detection output through a specific impedance determined by a capacitor C3 and a resistor R16. This square wave signal is processed through the integrating function achieved by the comparator amplifier unit 13 and a capacitor C4 to be output as a triangular wave, and ultimately, an AC bias current with the triangular wave flows to the detection winding Wd of the magnetic sensor element S.

The drive circuit 11, which receives the two square wave signals with their phases shifted from each other by a half cycle, then applies a pulse current which rises steeply, as illustrated in FIG. 2(c), to the magnetic body M of the magnetic sensor element S. The square wave signal at the collector side of the transistor Q3 is applied to the base of a transistor Q5 for switching via a series circuit constituted of a capacitor C11 and a resistor R23. The transistor Q5 for switching is inserted into the magnetic body and a current limiting resistor R25 in series. A diode D3 for clamping is connected between the source input line 6 and the connecting point of the capacitor C10 and a resistor R22. A resistor 21 is connected between the emitter and the base of the transistor Q5.

In addition, the square wave signal at the collector side of the transistor Q4 is applied to the base of the transistor Q5 for switching through a series circuit constituted of a capacitor C11 and the resistor R23. A diode D4 for clamping is connected between the source input line 6 and the connecting point of the capacitor C11 and the resistor R23.

As a result of a switching operation performed by the transistor Q5 in synchronization with the turning ON of the transistors Q3 and Q4 included in the oscillator 10 for sampling signal generation, a pulse current which rises steeply is supplied to the magnetic body M of the magnetic sensor element S as illustrated in FIG. 2(c), at the peak of the AC bias current of the triangular wave having the oscillation frequency fs (see FIG. 2(d)). The pulse current is supplied twice during one cycle.

The output current from the comparator amplifier unit 13 is supplied to a series circuit constituted of the detection winding Wd of the magnetic sensor element S, a coil for high frequency blocking L1 and the resistor R10. One end at another side of the series circuit is connected to a reference voltage terminal Vref. The reference voltage terminal Vref is connected to the middle point of a series connection of a resistor R10 and a constant voltage diode D1, and its voltage is maintained at a constant size by the constant voltage diode D1. The voltage value at the reference voltage terminal Vref is maintained at a value around 2.5 V, for instance, if the voltage at the DC source E is 5V. The series circuit constituted of the resistor R10 and the constant voltage diode D1 is connected between the source input line 6 and the earth ground line 7. In addition, the connecting point of the coil for high frequency blocking L1 and the resistor R10 is connected to an output terminal Vout. The resistor R10 achieves an output voltage which is in proportion to the DC bias current flowing through the detection winding Wd of the magnetic sensor element S, i.e., in proportion to an external magnetic field.

The comparator amplifier unit 13 is provided with an operational amplifier OP. A comparison reference voltage Vcom achieved by dividing the source voltage between a resistor R1 and a resistor R2 is added to a non-inverted input of the operational amplifier OP via a resistor R11. A pulse-type electric signal generated from the detection winding Wd travels through a capacitor C6 fulfilling a DC cutting function and is superimposed on the comparison reference voltage Vcom. The positive and negative signals contained in the pulse-type electric signal generated from the detection winding Wd are respectively detected through the transistors Q1 and Q2. A middle point value obtained at the connecting point of resistors R4 and R5 to the inverted input of the operational amplifier through the resistor R7 is added based upon these peak values. It is to be noted that resistors R3 and R6 are discharge resistors for resetting the capacitors C1 and C2. Furthermore, the comparator amplifier unit 13 is provided with a parallel circuit constituted of a resistor R8 and a capacitor C4 and a parallel circuit constituted of a resistor R9 and a capacitor C5. The parallel circuit constituted of the resistor R8 and the capacitor C4 is connected between the input and the output of the operational amplifier OP, whereas the parallel circuit constituted of the resistor R9 and the capacitor C5 is inserted between the output of the operational amplifier OP and the detection winding Wd. The degree of amplification achieved at the operational amplifier OP is determined based upon the ratio of the resistor R7 and the resistor R8. The capacitor C4 converts a square wave signal to a triangular wave signal. The capacitor C5 fulfills a function of causing one end of the detection winding Wd of the magnetic sensor element S to bypass to the earth ground line 7 (earth terminal COM) through the output of the operational amplifier OP.

With regard to the polarity and the size of the signal provided by the detection winding Wd, the negative pulse signal becomes large to lower the potential at the capacitor C2 when a DC bias current flows from the reference voltage side to the operational amplifier side. In other words, the potential at the inversion terminal of the operational amplifier OP is reduced and the output from the operational amplifier OP is raised to constitute a negative feedback control circuit.

The output current of the comparator amplifier unit 13 is constituted by superimposing a triangular wave AC ripple current indicated by the solid line in FIG. 2(d) on the DC bias current achieved the peak value detection unit 12, with the positive and negative peaks of the triangular wave in synchronization with the square wave signal of the oscillator 10 for sampling signal generation. In other words, they are in synchronization with the rise of the pulse current for sampling in FIG. 2(c).

Figure 2:
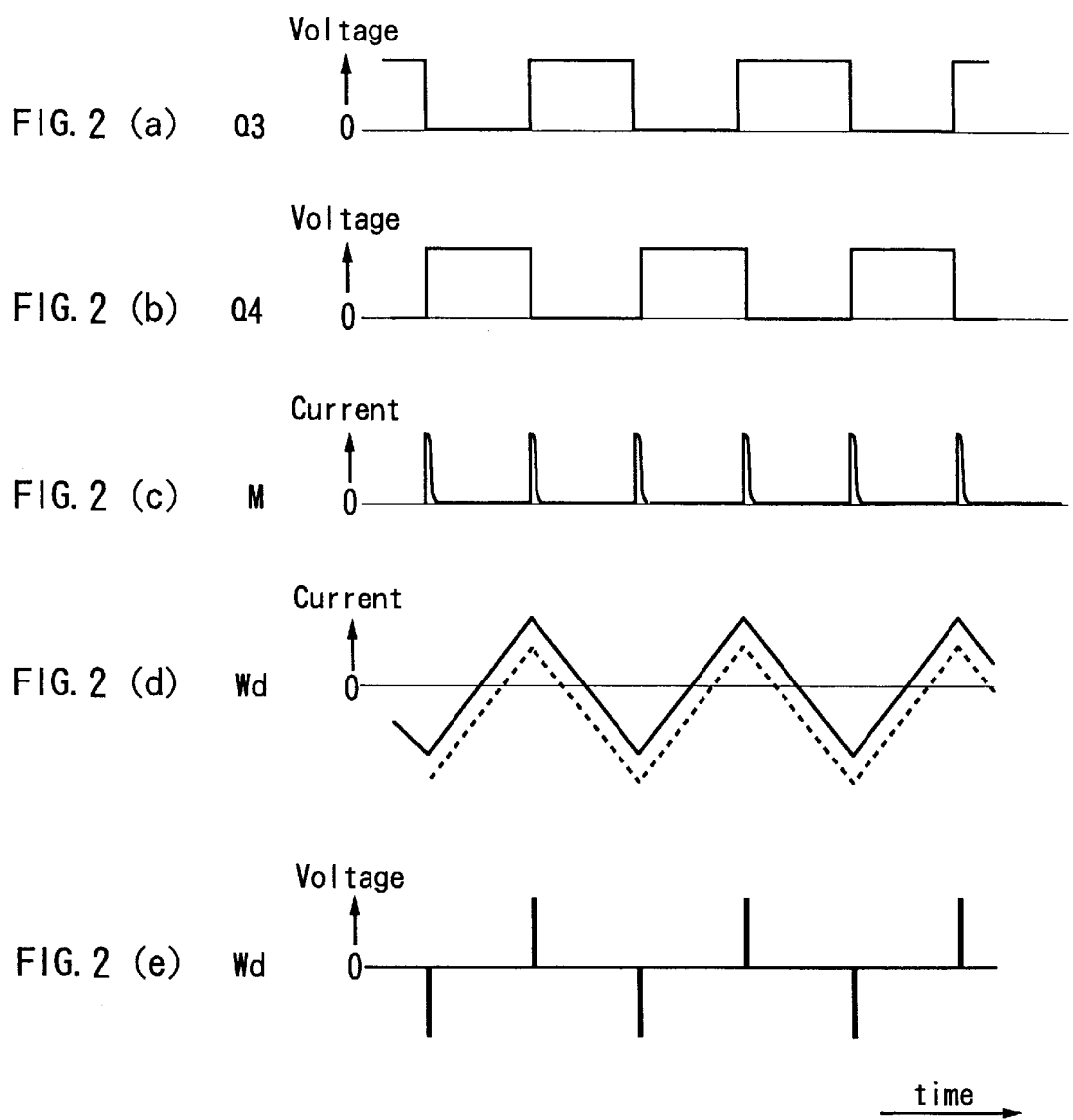
FIG. 2(a) presents the waveform of an output voltage from the oscillator for sampling signal generation included in the magnetic sensor apparatus according to the present invention.
FIG. 2(b) presents another waveform of an output voltage from the oscillator for sampling signal generation included in the magnetic sensor apparatus according to the present invention.
FIG. 2(c) presents the waveform of the pulse current achieved by the drive circuit included in the magnetic sensor apparatus according to the present invention.
FIG. 2(d) presents the waveform of the AC ripple current supplied to the detection winding of the magnetic sensor element by the comparator amplifier unit included in the magnetic sensor apparatus according to the present invention.
FIG. 2(e) presents the waveform of the voltage induced at the detection winding included in the magnetic sensor apparatus according to the present invention.

When a pulse current with a steep rise, as illustrated in FIG. 2(c) is supplied by the drive circuit 11 to the magnetic body M of the magnetic sensor element S, a pulse-type induced voltage having a peak value which is in proportion to the total magnetic field H in the lengthwise direction of the magnetic body M is obtained at the detection winding Wd as shown in FIG. 2 (e). The total magnetic field H represents the total sum of the original external magnetic field Hex which is the magnetic field to be detected and the magnetic field achieved by the AC ripple current of the triangular wave and the DC bias flowing through the detection winding Wd. In this case, since the polarity of the ripple magnetic field Hrip is alternately inverted, the polarity of the pulse-type induced voltage illustrated in FIG. 2(e), too, is alternately inverted. In addition, if there is no magnetic field Hex to be detected, control is implemented to set the DC bias magnetic field to zero and, as a result, with only the AC ripple magnetic field Hrip achieved through the AC ripple current of the triangular wave present, the absolute values of the positive and negative peaks remain the same even if the polarity of the pulse-type induced voltage is alternately inverted. It is to be noted that the positive and negative peaks of the AC ripple magnetic field Hrip are set at a size that exceeds the hysteresis of the magnetic body M. In other words, they are set at a size exceeding the coercivity. With respect to H, Hex and Hrip, please refer to FIG. 3.

The peak value detection unit 12 fulfills a function for holding the positive and negative peak values of the pulse-type induced voltage illustrated in FIG. 2(e) induced at the detection winding Wd when the pulse current for sampling in FIG. 2(c) achieved by the drive circuit 11 is applied to the magnetic sensor element S. In other words, the series circuit constituted of the transistor Q1 and the capacitor C1 for positive peak value holding is connected between the source input line 6 and the earth ground line 7, and the pulse-type induced voltage is applied to the base of the transistor Q1 connected to the connecting point of the resistors R1 and R2 via the capacitor C6 for DC blocking. Likewise, the series circuit constituted of the capacitor C2 for negative peak value holding and the transistor Q2 is connected between the source input line 6 and the earth ground line 7 and the pulse-type induced voltage is also applied to the base of the transistor Q2 via the capacitor C6 for DC blocking.

The charge voltage at the capacitor C1, which corresponds to the positive peak value of the pulse-type induced voltage in FIG. 2(e), is supplied to the two ends of the discharge resistor R6, whereas the charge voltage at the capacitor C2, which corresponds to the negative peak value, is supplied to the two ends of the discharge resistor R3. The values at the resistors R4 and R5 are set so that when the external magnetic field is zero, the absolute values of the positive peak value and the negative peak value become equal to each other, the potential at the middle point of the voltage divider circuit constituted of the resistors R4 and R5 approximately matches the DC size of the non-inverted input of the operational amplifier OP included in the comparator amplifier unit 13 and no DC current component manifests on the output side of the operational amplifier.

Next, the overall operation achieved in this embodiment is explained.

If the original external magnetic field Hex, which is the magnetic field to be detected, is not present in the direction of the length of the magnetic body M constituting the magnetic sensor element S, the total magnetic field H is only constituted of the AC ripple magnetic field Hrip which is generated by supplying the AC ripple current of the triangular wave indicated by the solid line in FIG. 2(d) from the comparator amplifier unit 13 to the detection winding Wd. The pulse current in FIG. 2(c), which is applied to the magnetic body M with the timing with which the ripple magnetic field Hrip achieves the positive and negative peaks, generates a pulse-type induced voltage whose polarities are alternately inverted at the detection winding Wd, as illustrated in FIG. 2(e). The pulse-type induced voltage is in proportion to the product of the rate of change in the magnetic permeability of the magnetic body M and the total magnetic field H. Since the absolute values of the positive and negative peaks of the AC ripple magnetic field Hrip are equal to each other, the absolute values of the positive and negative peak in the pulse-type induced voltage are equal to each other. In addition, at this point, only the ripple current of the triangular wave flows to the detection winding Wd, with no DC current component flowing to the resistor R10 provided between the output terminal Vout and the reference voltage terminal Vref, thereby setting the DC potential difference between the output terminal Vout and the reference voltage terminal Vref to zero.

Now, if there is a magnetic field Hex to be detected such as geomagnetism with its direction matching a positive half-cycle of the AC ripple magnetic field Hrip, the total magnetic field H has an intensity achieved by adding the ripple magnetic field Hrip and the magnetic field Hex to be detected in the positive half-cycle of the ripple magnetic field Hrip and has an intensity achieved by subtracting the magnetic field Hex to be detected from the ripple magnetic field Hrip in the negative half-cycle of the ripple magnetic field Hrip. Because of this, at the peak value detection unit 12, the charge voltage of the capacitor C1, which corresponds to the positive peak value of the pulse-type induced voltage in FIG. 2(e), becomes high, whereas the charge voltage of the capacitor C2, which corresponds to the negative peak value, becomes low. As a result, the DC potential of the inverted input at the operational amplifier OP shifts toward high and the DC voltage size on the output side of the operational amplifier OP shifts toward low. Thus, the ripple current of the triangular wave flowing from the comparator amplifier unit 13 to the detection winding Wd changes as indicated by the dotted line in FIG. 2(d). In this case, the waveform itself does not change but the DC current component is superimposed on it. Consequently, the absolute value of the peak in the positive half-cycle of the ripple magnetic field Hrip becomes reduced and the absolute value of the peak in the negative half-cycle of the ripple magnetic field Hrip increases.

Through the negative feedback control performed by the comparator amplifier unit 13 described above, the total magnetic field H in the positive half-cycle of the ripple magnetic field Hrip and the total magnetic field H in the negative half-cycle achieve balance, and stability is achieved in a state in which the absolute values of the positive and negative peak values of the pulse-type induced voltage in FIG. 2(e) are equal to each other. At this point, as the waveform presented with the dotted line in FIG. 2(d) clearly indicates, a DC current component, which flows to the resistor R10 between the output terminal Vout and the reference voltage terminal Vref is generated and a DC potential difference is generated between the output terminal Vout and the reference voltage terminal Vref. This DC potential difference is in proportion to the magnetic field Hex to be detected such as geomagnetism. The magnetic field Hex to be detected constitutes a component applied in the direction of the length of the magnetic body M.

It is to be noted that when the direction of the magnetic field Hex to be detected such as geomagnetism matches the negative half-cycle of the ripple magnetic field Hrip, the polarity of the DC potential difference between the output terminal Vout and the reference voltage terminal Vref becomes reversed.

In the embodiment described above, the average value of the internal magnetic field at the magnetic sensor element S is controlled to be at zero at all times, and thus, no induced voltage is generated at the detection winding Wd as it is. What is noteworthy about the embodiment is that in order to obtain an induced voltage, an AC ripple magnetic field achieved by an AC ripple current is superimposed. Since the frequency of the ripple current is equal to the frequency fs, i.e., the oscillation frequency at the oscillator 10 for sampling signal generation and a sampling pulse current flows to the magnetic body at the positive and negative peaks of the ripple current, the induced voltage is generated with a timing with which it achieves the maximum value.

Through this embodiment, the following advantages are achieved.

(1) Instead of the unstable bias method in the prior art in which a DC bias current is superimposed on the detection winding Wd of the magnetic sensor S, an AC ripple current which is in synchronization with the sampling pulse current is supplied to the detection winding Wd to detect an external magnetic field to be detected such as geomagnetism even when the DC bias magnetic field is zero.

(2) With the operating principle being that equilibrium is achieved at the point at which the absolute values of the positive and negative peak values of the pulse-type induced voltage induced at the detection winding Wd whose polarities are alternately inverted become equal to each other, there is no change of the equilibrium point even if the absolute values of the positive and negative peak values fluctuate due to fluctuations of the sensitivity of the sensor element. As a result, the inconsistency in the characteristics of the magnetic body M of the magnetic sensor S and output fluctuations occuring due to factors such as the temperature, distortion and drift can be greatly reduced.

(3) In addition, since no DC bias magnetic field is applied, a dynamic range which is almost twice that in the prior art is achieved.

It is to be noted that while an astable multivibrator is employed to constitute the oscillator 10 for sampling signal generation in the embodiment, another type of pulse generator (square wave generator) may be employed.

In addition, while the explanation has been given on an example in which a DC voltage between the output terminal Vout and the reference voltage terminal Vref is extracted in order to detect the magnetic field to be detected, a DC voltage between the output terminal Vout and the earth terminal COM may be extracted for the same purpose, instead.

Figure 3:
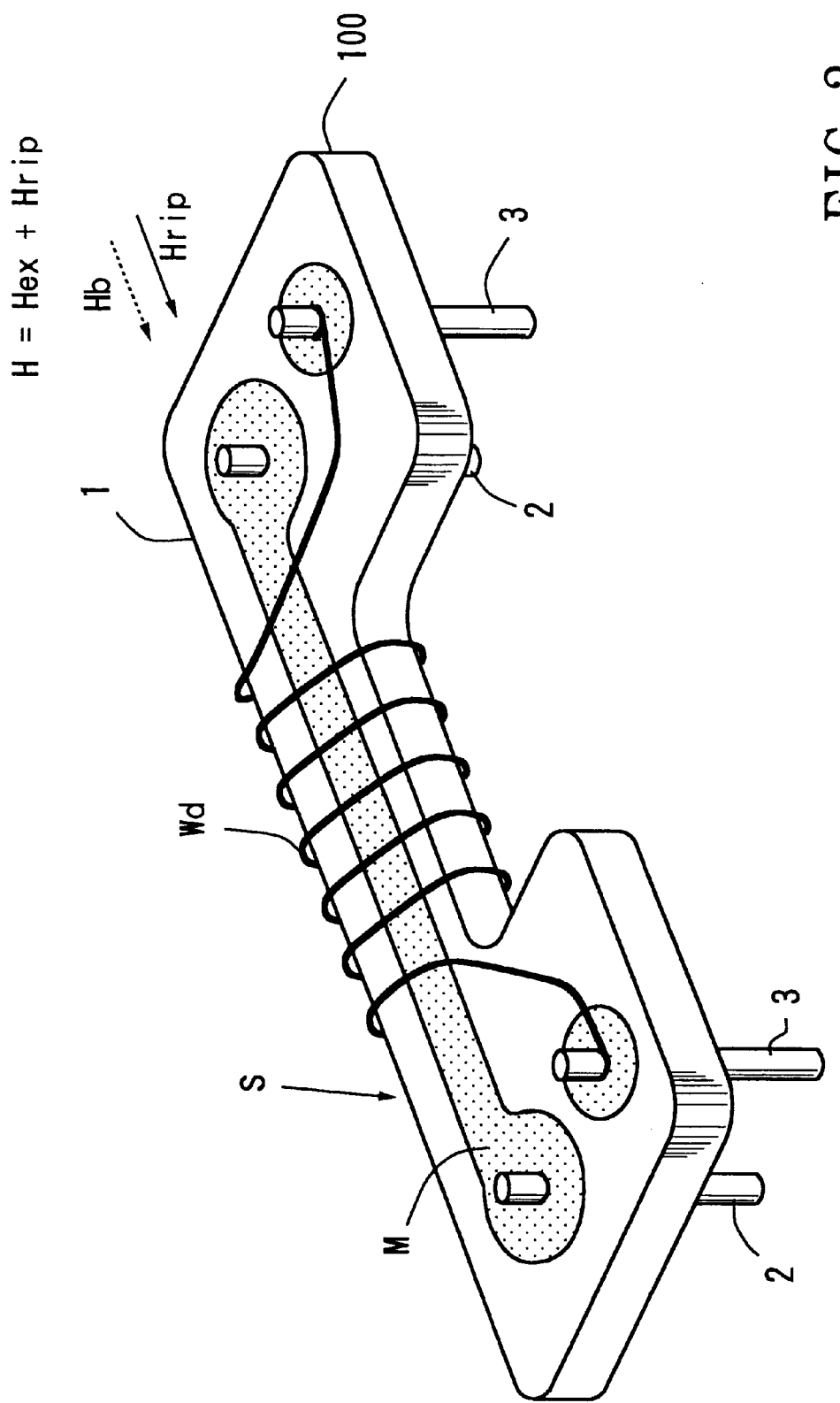
FIG. 3 is a perspective illustrating a magnetic sensor element adopting the cross flux gate method.

FIG. 3 illustrates an example of a magnetic sensor element which may be employed in the magnetic sensor apparatus according to the present invention. The magnetic sensor element is constituted by etching a band-like amorphous magnetic alloy foil having a conductive property which is pasted onto an insulating substrate 1 constituted of epoxy resin or the like to form a magnetic conductor M achieving a specific pattern and winding around the periphery of a magnetic body 100 to constitute a detection winding Wd.

The magnetic conductor M, which is formed in a shape having a linear portion in the lengthwise direction, has dimensions of, for instance, 5 mm (width)×15 mm (length). The two ends of the magnetic conductor M are each connected to an excitation terminal 2 secured to the insulating substrate 1, with the two lead-out ends of the detection winding Wd each connected to a detection terminal 3 secured to the insulating substrate 1.

Figure 4:
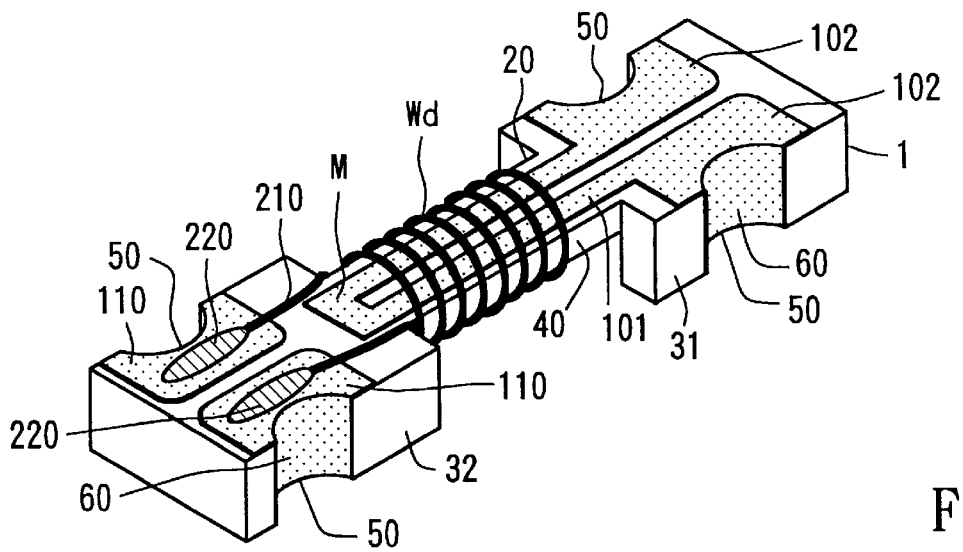
FIG. 4 is a perspective illustrating the magnetic sensor element according to the present invention.
Figure 5:
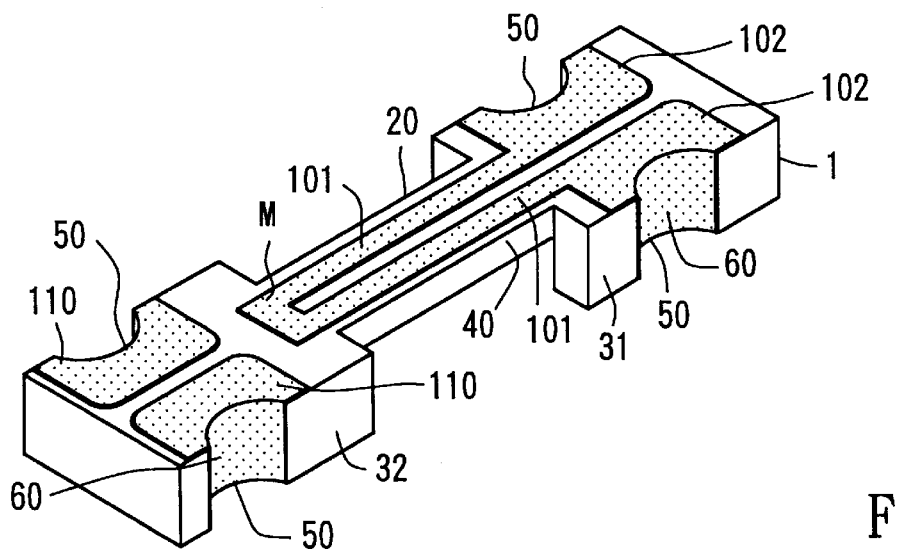
FIG. 5 is a perspective of the substrate constituting the magnetic sensor element illustrated in FIG. 4.

FIG. 4 is a perspective illustrating another example of a magnetic sensor element which may be employed in the magnetic sensor apparatus according to the present invention, and FIG. 5 is a perspective of the substrate constituting the magnetic sensor element illustrated in FIG. 4. In FIGS. 4 and 5, the magnetic sensor element includes a non-magnetic insulating substrate 1. The insulating substrate 1 includes terminal formation portions 31 and 32 that are wider than a torso portion 20 for winding at the two sides of the torso portion 20 for winding, and is also provided with a staged surface 40 at the bottom surface of the torso portion 20 for winding, which is recessed further than the bottom surfaces of the terminal formation portions 31 and 32. In addition, grooves 50 that pass through the insulating substrate 1 in the direction of the thickness are provided at the terminal formation portions 31 and 32. At the internal surface of each groove 50, an electrode film or external connection 60 for surface mounting is formed. A set of the groove 50 and the electrode film for external connection 60 at its internal surface is formed at each side surface of the terminal formation portion 31 and at each side surface of the terminal formation portion 32, to achieve a total of four sets. The grooves 50 are recessed grooves each constituted by dividing a through hole into two to achieve a semicircular cross section. The electrode films for external connection 60 are constituted of a metal conductor film formed by employing the electroless plating technology, the electrolytic plating technology or the like.

At the upper surface of the insulating substrate 1, the magnetic conductor M for external magnetic field detection constituted of an amorphous magnetic alloy foil and terminal connection lands 110 for winding terminal end processing on the detection winding Wd are secured through bonding or the like. The magnetic conductor M constituted of the amorphous magnetic alloy foil, which is formed by folding back a pair of parallel linear portions 101 in a U-shaped, achieves a pattern having a terminal connection land 102 at each of its two ends. The linear portions 101 are parallel to the lengthwise direction of the insulating substrate 1. The terminal connection lands 102 are provided on the terminal formation portion 31 and are directly connected to the electrode films for external connection 60 for surface mounting. The pair of terminal connection lands 110 formed concurrently by using an amorphous magnetic alloy foil are both provided at the terminal formation portion 32, and are connected to the electrode films for external connection 60 at the two sides of the terminal formation portion 32. A cobalt amorphous magnetic alloy foil (magnetic permeability $\mu$: 30,000 to 1,000,000) is ideal for this application since it achieves a high magnetic permeability, a low degree of magnetostriction and a constant coercivity to satisfy the requirement for a high degree of sensitivity (a large output voltage must be generated relative to a minute change in the magnetic field).

Figure 6:
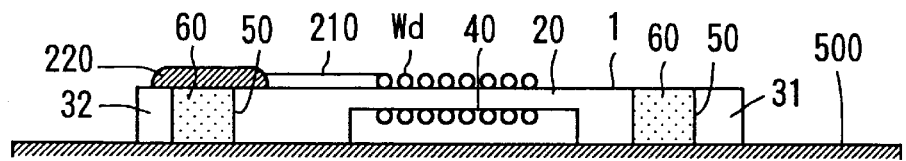
FIG. 6 is a partial sectional view illustrating an operating state of the magnetic sensor element illustrated in FIG. 4.

The detection winding Wd is wound around the staged surface 40 using an insulation-coated wire such as urethane wire to travel around the periphery of the torso portion 20 for winding and the linear portions 101 formed at the torso portion at the insulating substrate 1, with winding terminal ends 21 of the detection winding Wd connected to the terminal connection lands 110 through soldering or through the use of a conductive adhesive 220 (as a result, they are taken out at the electrode films for external connection 60 toward the terminal formation portion 32). As illustrated in FIG. 6, when mounting the insulating substrate 1 of the magnetic sensor element on a circuit substrate 500, the bottom surface of the detection winding Wd should be prevented from projecting out from the bottom surfaces of the terminal formation portions 31 and 32 to ensure that the detection winding Wd does not come in contact with the surface of the circuit substrate 500. It is even more desirable that the bottom surface of the detection winding Wd be recessed relative to the bottom surfaces of the terminal formation portions 31 and 32.

With the magnetic sensor element explained in this embodiment, which adopts the cross flux gate structure, the magnetic permeability of the magnetic conductor M can be changed by applying a pulse voltage between the electrode films for external connection 60 and 60 at the terminal positioning area 31 to supply a pulsed exciting current to the magnetic conductor M having a pair of parallel linear portions 101, and an electrical signal which is in proportion to an external magnetic field can be extracted at the two ends of the detection winding Wd, i.e., between the electrode films for external connection 60 and 60 at the terminal formation portion 32.

In this structure, since the linear portions 101 constituting a pair are provided parallel to each other at the magnetic conductor M, and consequently, the same current travels back and forth, the magnetic flux resulting from the current flowing through the linear portion in the forward path and the magnetic flux resulting form the current flowing through the linear portion in the backward path cancel each other out, which achieves a great reduction in the excitation noise due to the trans linking caused by the linear portions 101 and the detection winding Wd not extending completely perpendicular to each other or the like, compared to the magnetic sensor illustrated in FIG. 3.

While the invention has been particularly shown and described with respect to a preferred embodiment thereof by referring to the attached drawings, the present invention is not limited to this example and it will be understood by those skilled in the art that various changes in form and detail may be made therein without departing from the spirit, scope and teaching of the invention.

As explained above, according to the magnetic sensor apparatus in the present invention, an improvement in yield is achieved since it is not necessary to implement characteristic selection for the magnetic body of the magnetic sensor element. In addition, due to its operating principle, a highly stable magnetic sensor apparatus that is not subject to influences of the sensitivity of the magnetic body, the output temperature characteristics and the like is achieved.

It is to be noted that while the magnetic sensor apparatus according to the present invention is ideal for detecting a static magnetic field such as a very weak geomagnetism, it may also be adopted for detection of a dynamic magnetic field. Furthermore, it may also be adopted in applications such as a cathode-ray tube display monitor, direction finding performed by a navigation apparatus and three-dimensional display (virtual reality), in which the influence of geomagnetism is to be canceled out.

What is claimed is:

1. A magnetic sensor element comprising:

a non-magnetic insulating substrate;

a magnetic conductor constituted of an amorphous magnetic alloy and having a pair of parallel linear portions, is provided at said non-magnetic insulating substrate, with said pair of parallel linear portions folded back at one end and left open at another end; and a detection winding provided around said non-magnetic insulating substrate and said pair of linear portions at said magnetic conductor.

2. The magnetic sensor element of claim 1 wherein said insulating substrate is provided with a terminal formation portion on at least one side of a torso portion for winding, with said terminal formation portion having terminals for external connection to be connected with an end of said magnetic conductor and a terminal end of said detection winding; and said detecting winding is wound around said torso portion for winding.

3. The magnetic sensor element of claim 2 wherein said terminal formation portion is provided with a terminal for external connection for surface mounting; and said terminal for external connection for surface mounting is constituted by forming an electrode film at an internal surface of a groove or a hole passing through said insulating substrate in a direction of the thickness thereof.

4. The magnetic sensor element of claim 3 wherein said magnetic conductor extends along the circumferential edge of said groove or said hole to be directly connected with said electrode film.

5. The magnetic sensor element of claim 1, wherein said insulating substrate is provided with a staged surface recessed further relative to said terminal formation portion, at a bottom surface of said torso portion for winding; and said detection winding is mounted to wind around said torso portion for winding and pass through said staged surface while not projecting out from a bottom surface of said terminal formation portion of said substrate.

6. A magnetic sensor apparatus comprising:

the magnetic sensor element as defined in any one of claims 1 through 4, said magnetic sensor element generating a pulse-type electric signal in proportion to a rate of change of magnetic permeability of said magnetic conductor and the size of an external magnetic field at said detection winding;

a means for excitation that cyclically changes said magnetic permeability of said magnetic conductor by supplying a pulse-type drive current for sampling to said magnetic conductor;

a peak detection unit that detects a positive peak value and a negative peak value of said pulse-type electric signal; and a feedback circuit that supplies an AC current which is in synchronization with said pulse-type drive current for sampling to said detection winding and superimposes a DC current component on said AC current to set absolute values of said positive peak value and said negative peak value of said pulse-type electric signal equal to each other, wherein said detection winding outputs a detection signal containing a DC current component corresponding to the size of a magnetic field to be detected.

7. The magnetic sensor apparatus of claim 6, wherein said means for excitation is provided with an oscillator for regulating a cyclical frequency of said pulse-type drive current and sets said positive peak value and said negative peak value of said pulse-type electric signal in synchronization with cycles of said pulse-type drive current for sampling by adding a signal from said oscillator to a portion of said feedback circuit.

* * * * *